(12) United States Patent
Rajagopal et al.

(10) Patent No.: US 12,707,689 B2
(45) Date of Patent: Aug. 11, 2026

(54) ANTIMONY-GALLIUM-ZINC-OXIDE MATERIALS

(71) Applicant: Micron Technology, Inc., Boise, ID (US)

(72) Inventors: Adharsh Rajagopal, Boise, ID (US); Scott E. Sills, Boise, ID (US); Sumeet C. Pandey, Meridian, ID (US); David M. Guzman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 620 days.

(21) Appl. No.: 17/712,294

(22) Filed: Apr. 4, 2022

(65) Prior Publication Data

US 2023/0317798 A1 Oct. 5, 2023

(51) Int. Cl.

| | |
|---|---|
| ***H10D 62/80*** | (2025.01) |
| ***H10B 12/00*** | (2023.01) |
| ***H10D 30/67*** | (2025.01) |
| ***H10D 99/00*** | (2025.01) |
| ***H10P 14/20*** | (2026.01) |
| ***H10P 14/22*** | (2026.01) |
| ***H10P 14/24*** | (2026.01) |

(52) U.S. Cl.

CPC ............ *H10D 62/80* (2025.01); *H10B 12/00* (2023.02); *H10D 30/6755* (2025.01); *H10D 99/00* (2025.01); *H10P 14/22* (2026.01); *H10P 14/24* (2026.01); *H10P 14/3434* (2026.01)

(58) Field of Classification Search

CPC ..... H01L 29/24; H01L 29/247; H01L 29/263; H01L 29/26; H01L 21/02554; H01L 21/02565; H01L 21/02631; H10D 30/6755; H10D 30/6757; H10D 62/80; H10D 86/423; H10D 30/6728; H10D 30/675

See application file for complete search history.

(56) References Cited

U.S. PATENT DOCUMENTS

| | | | | |
|---|---|---|---|---|
| 10,607,995 | B2 | 3/2020 | Roberts et al. | |
| 2006/0163655 | A1* | 7/2006 | Hoffman ............ | H10D 30/6755 438/149 |
| 2007/0072439 | A1* | 3/2007 | Akimoto ............ | H10D 30/6755 438/795 |
| 2010/0301328 | A1* | 12/2010 | Yamazaki .............. | H10D 86/60 257/43 |
| 2016/0315198 | A1* | 10/2016 | Inoue ................. | H10D 30/6713 |
| 2016/0329432 | A1* | 11/2016 | Park ................... | H10D 30/6757 |
| 2018/0323200 | A1 | 11/2018 | Tang et al. | |
| 2019/0103406 | A1 | 4/2019 | Tang et al. | |
| 2019/0164985 | A1 | 5/2019 | Lee et al. | |
| 2021/0013226 | A1 | 1/2021 | Tang et al. | |

OTHER PUBLICATIONS

Tien-Tzu Yang, Dong-Hau Kuo, p-type IGZO by the substitution of antimony with a sol-gel method: Explanation with the aid of defect formation equation, 2020, Materials Today Communications, vol. 24, (Year: 2020).*

* cited by examiner

*Primary Examiner* — Jessica S Manno
*Assistant Examiner* — Victor Joseph Lasasso
(74) *Attorney, Agent, or Firm* — Brooks, Cameron & Huebsch, PLLC

(57) ABSTRACT

Systems, methods and apparatus are provided for transistors having a first source/drain region, a second source/drain region, and a channel region, wherein the channel region comprises an antimony-gallium-zinc-oxide (SbGZO) material.

22 Claims, 3 Drawing Sheets

ANTIMONY-GALLIUM-ZINC-OXIDE MATERIALS

TECHNICAL FIELD

The present disclosure relates generally to antimony-gallium-zinc oxide (SbGZO) materials, and more particularly, to transistors including a channel region that includes a SbGZO material.

BACKGROUND

Memory is one type of integrated circuitry and can be used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a “0” or a “1”. In other systems, at least some individual memory cells may be configured to store more than two levels or states of information.

A transistor is one type of electronic component that may be used in a memory cell. These transistors can include a pair of conductive source/drain regions having a semiconductive channel region there-between. A conductive gate can be adjacent the channel region and be separated there-from by a thin gate insulator. Application of a suitable voltage to the gate allows current to flow from one of the source/drain regions to the other through the channel region. When the voltage is removed from the gate, current is largely prevented from flowing through the channel region.

Transistors may be used in circuitry other than memory circuitry.

DETAILED DESCRIPTION

Figure 1:
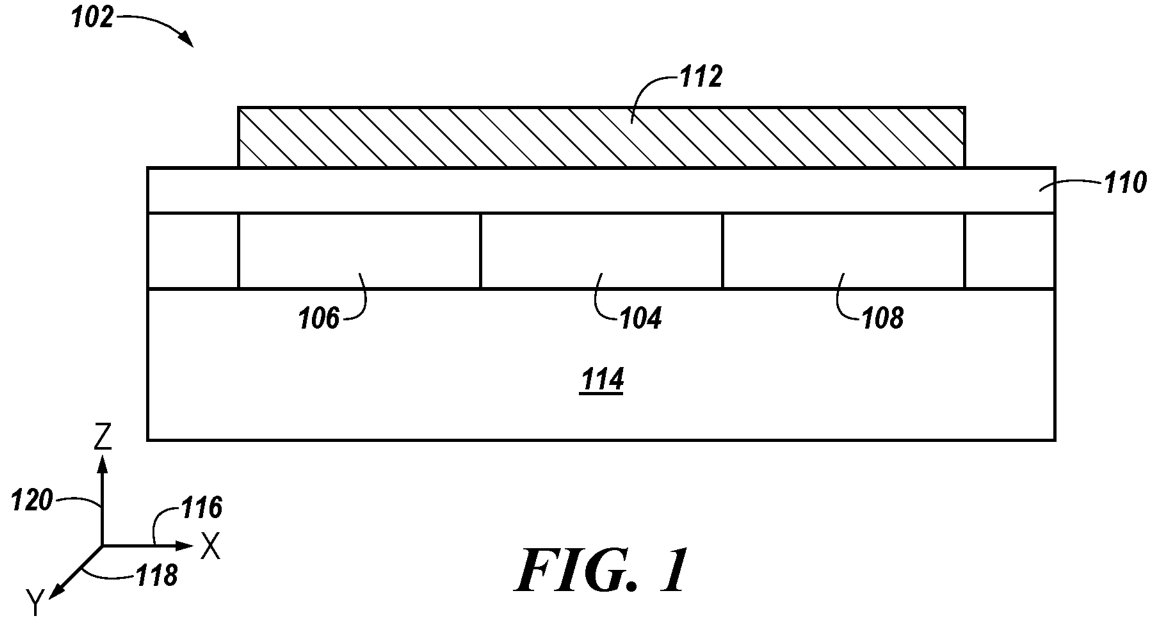
FIG. 1 is a view of a portion of an example of a transistor, in accordance with an embodiment of the present disclosure.

The present disclosure includes apparatuses, methods, and systems for transistors having a first source/drain region, a second source drain/region, and a channel region that includes an antimony-gallium-zinc-oxide (SbGZO) material.

Some previous transistors have incorporated indium into gallium-zinc-oxide to provide a channel material, e.g., IGZO. However, incorporating antimony, rather than solely indium, into gallium-zinc-oxide (GZO) provides an increased range of utilizable materials. For instance, antimony has a greater range of solid solution solubility, e.g., with gallium-zinc-oxide, as compared to indium.

This greater range of solid solution solubility, e.g., of antimony as compared to indium, can provide a broader range, e.g., more variation, of material compositions. As such, utilizing the SbGZO materials, as disclosed herein, provides a broader range, e.g., more variation, of electrical properties, such as intrinsic performance, as compared to utilizing indium.

Also, band structure analysis and density of states, which can refer to a number of states per unit energy and per unit volume, analysis provide that GZO, e.g., $Ga_2ZnO_4$, is intrinsically undoped. Density of states analysis indicates that incorporation of indium into GZO does not perturb the Fermi level position, which indicates that the incorporation of indium into GZO provides a negligible or no doping effect. However, in contrast to indium, density of states analysis indicates that incorporation of antimony into GZO does move the Fermi level position away from a valence band, which indicates that the incorporation of antimony into GZO provides an n-type doping effect. As such, the SbGZO material can be referred to as an n-type material.

Embodiments of the present disclosure provide that the SbGZO material can have a formula: $(Sb_xGa_{1-x})_2ZnO_y$, where x has a value from 0.05 to 1.00, inclusive, while y is not a controlled variable. For instance, x can have a value from a lower limit of 0.05, 0.08, or 0.10 to an upper limit of 1.00, 0.95, or 0.90, inclusive.

Embodiments of the present disclosure provide that the SbGZO material can be utilized with IGZO (which can also be referred to as gallium indium zinc oxide (GIZO)). In other words, both antimony and indium can be incorporated into the GZO material. For instance, when both antimony and indium are utilized, the antimony may be from 2 to 99.9 mole % based upon a total mole % of the antimony and the indium. Such mole % can provide the one or more of the benefits discussed herein. As an example, antimony may be from a lower limit of 2, 3, or 5 mole % to an upper limit of 99.9, 99, or 95 mole % based upon a total mole % of the antimony and the indium. Other materials that may be utilized for the transistors disclosed herein, in differing amounts for various applications, include zinc tin oxide (ZTO), IZO, ZnOx, InOx, In2O3, SnO2, TiOx, ZnxOyNz, MgxZnyOz, InxZnyOz, InxGayZnzOa, ZrxInyZnzOa, HfxInyZnzOa, SnxInyZnzOa, AlxSnyInzZnaOd, SixInyZnzOa, ZnxSnyOz, AlxZnySnzOa, GaxZnySnzOa, GaxZnySnzInaOd, ZrxZnySnzOa, InGaSiO, and other similar materials.

One or more embodiments provide that a channel region, as discussed further herein, includes an oxide material, e.g., as discussed herein, doped with antimony. Embodiments provide that different amounts of antimony may be utilized for various applications. One or more embodiments provide that indium is not utilized, e.g., the channel region does not include indium.

As mentioned, the SbGZO material may be utilized to make a transistor, e.g., a thin-film transistor. These transistors may be incorporated in memory structures, memory cells, arrays including such memory cells, memory devices, switching devices, and other semiconductor devices including such arrays, systems including such arrays, and methods for fabricating and using such memory structures are also disclosed. Embodiments of the disclosure include a variety of different memory cells, e.g., volatile memory, non-volatile memory, and/or transistor configurations. Non-limiting examples include random-access memory (RAM), read only memory (ROM), dynamic random access memory (DRAM, synchronous dynamic random access memory (SDRAM), flash memory, resistive random access memory (ReRAM), conductive bridge random access memory (conductive bridge RAM), magnetoresistive random access memory (MRAM), phase change material (PCM) memory, phase change random access memory (PCRAM), spin-torque-transfer random access memory (STTRAM), oxygen vacancy-based memory, programmable conductor memory, ferroelectric random access memory (FE-RAM), reference field-effect transistors (RE-FET), for instance.

The transistors disclosed herein may be used in volatile memory cells, such as dynamic random access memory (DRAM) cells, and may be coupled to a storage element. The storage element may, for example, include storage node, e.g., that can be a capacitor, configured to store a logical state defined by the storage charge in the capacitor. Embodiments provide that other types of storage nodes may be utilized.

Some memory devices include memory arrays exhibiting memory cells arranged in a cross-point architecture including conductive lines. e.g., access lines, such as word lines, extending perpendicular, e.g., orthogonal, to additional conductive lines, e.g., data lines, such as digit lines. The memory arrays can be two-dimensional (2D) so as to exhibit a single deck, e.g., a single tier, a single level, of the memory cells, or can be three-dimensional (3D) so as to exhibit multiple decks, e.g., multiple levels, multiple tiers, of the memory cells. Select devices can be used to select particular memory cells of a 3D memory array. Embodiments additionally may include thin field transistors utilized in non-access device implementations. Non-limiting examples of which include deck selector devices, back end of line (BOEL) routing selector devices, for instance.

Embodiments of the present disclosure may include different configurations of transistors, e.g., thin-film transistors, including vertically oriented transistors, horizontally oriented transistors, e.g., planar, etc. The memory cells can include transistors formed from different materials, e.g., SbGZO and IGZO, exhibiting different bandgap and mobility properties.

As used herein, "a", "an", or "a number of" can refer to one or more of something, and "a plurality of" can refer to two or more such things. For example, a memory device can refer to one or more memory devices, and a plurality of memory devices can refer to two or more memory devices.

FIG. 1 is a view of a portion of an example of a transistor 102, in accordance with an embodiment of the present disclosure. Transistor 102 may include a channel region 104. As mentioned, embodiments provide that the channel region includes the SbGZO material.

Transistor 102 may include a first source/drain region 106 and a second source/drain region 108. One or more embodiments provide that at least one of the first source/drain region 106 and the second source/drain region 108 includes the SbGZO material. One or more embodiments provide that both of the first source/drain region 106 and the second source/drain region 108 include the SbGZO material. While first and second source/drain region references are used herein to denote two separate and distinct source/drain regions, it is not intended that the source/drain region referred to as the "first" and/or "second" source/drain regions have some unique meaning. The first source/drain region 106 and the second source/drain region 108 may respectively be formed from a doped semiconductor material, e.g., Si, SiGe, Ge, SiCo, Transition Metal Dichalcogenides (TMD), a metal, and/or metal composite materials containing ruthenium (Ru), molybdenum (Mo), nickel (Ni), titanium (Ti), copper (Cu), a doped conducting oxide, such as indium tin oxide (ITO), indium oxide, or semiconducting oxides like IGZO, IZO, SnZnO, among other materials. As shown in FIG. 1, the channel region 104 may be located between the first source/drain region 106 and the second source/drain region 108. One or more embodiments provide that indium is not utilized, e.g., the first source/drain region and the second source/drain region do not include indium.

Transistor 102 may include a dielectric material 110. The dielectric material 110 can be a high-k dielectric material, a silicon oxide material, a silicon nitride material, a silicon oxynitride material, etc., or a combination thereof. The dielectric material 110 can be an oxide material, such as silicon oxide, for instance. The dielectric material 110 can be a high-K material, such as hafnium oxide, hafnium silicon oxide, lanthanum oxide, zirconium oxide, hafnium zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc, niobium, aluminum scandium nitride or combinations thereof, for instance.

Transistor 102 may include a gate material 112. The gate material 112 can be configured to operatively interconnect with the channel region 104 to selectively allow current to pass through the channel region 104 when the transistor 102 is enable, e.g., "on". The gate material 112 can be conductive. The gate material 112 can include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and combinations thereof, for instance.

Transistor 102 may include a substrate 114. As used herein, the term "substrate" refers to a base material or construction upon which components, such as those of transistor 102, are formed. The substrate may be a semiconductor substrate, a base semiconductor layer on a supporting structure, a metal electrode, or a semiconductor substrate having one or more layers, structures, or regions formed thereon. While materials described and illustrated herein may be formed as layers, the materials are not limited thereto and may be formed in other three-dimensional configurations. The substrate may be a conventional silicon substrate or other bulk substrate including a layer of semiconductive material. As used herein, the term "bulk substrate" refers to not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation or other semiconductor or optoelectronic materials, such as silicon-germanium ($Si_{1-x}Ge_x$, where x may be, for example, between 0.2 and 0.8), germanium (Ge), gallium arsenide (GaAs), gallium nitride (GaN), or indium phosphide (InP). The substrate may be doped or may be undoped.

Transistor 102 may be referred to as a top gate transistor, e.g., the gate material 112 can be formed on top of the channel region 104, the first source/drain region 106, the second source/drain region 108, and the dielectric material 110 relative to the substrate 114.

As shown in FIG. 1, an x-y-z coordinate system includes a horizontal x-direction 116, a horizontal y-direction 118, and a vertical z-direction 120. Embodiments provide that current flows predominantly in the x-direction 116, e.g., from source/drain region to channel region to source/drain region. As such, transistor 102 may be referred to as being horizontally oriented.

Figure 2:
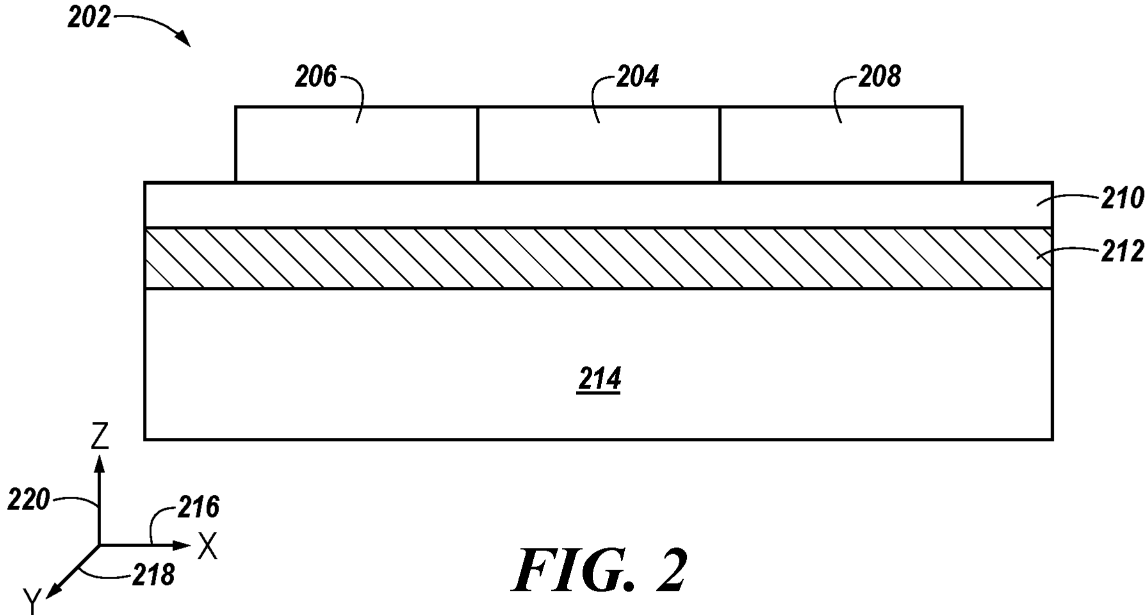
FIG. 2 is a view of a portion of an example of a transistor, in accordance with an embodiment of the present disclosure.

FIG. 2 is a view of a portion of an example of a transistor 202, in accordance with an embodiment of the present disclosure. Transistor 202 may include a channel region 204. As mentioned, embodiments provide that the channel region includes the SbGZO material. The channel region 204 can be formed from materials, as discussed with the channel region 104 shown in FIG. 1.

Transistor 202 can include a first source/drain region 206 and a second source/drain region 208. The first source/drain region 206 and the second source/drain region 208 can be formed from materials, as discussed with the first source/drain region 106 and the second source/drain region 108 shown in FIG. 1. As shown in FIG. 2, the channel region 204 may be located between the first source/drain region 206 and the second source/drain region 208.

Transistor 202 may include a dielectric material 210. The dielectric material 210 can be formed from materials, as discussed with the dielectric material 110 shown in FIG. 1.

Transistor 202 may include a gate material 212. The gate material 212 can be formed from materials, as discussed with the gate material 112 shown in FIG. 1.

Transistor 202 may include a substrate 214. The substrate 214 can be formed from materials, as discussed with the substrate 114 shown in FIG. 1.

Transistor 202 may be referred to as a bottom gate transistor, e.g., the channel region 204, the first source/drain region 206, the second source/drain region 208, and the dielectric material 210 can be formed on top of the gate material 212 relative to the substrate 214.

FIG. 2 includes an x-y-z coordinate system including a horizontal x-direction 216, a horizontal y-direction 218, and a vertical z-direction 220. Embodiments provide that current flows predominantly in the x-direction 216, e.g., from source/drain region to channel region to source/drain region. As such, transistor 202 may be referred to as being horizontally oriented.

Figure 3:
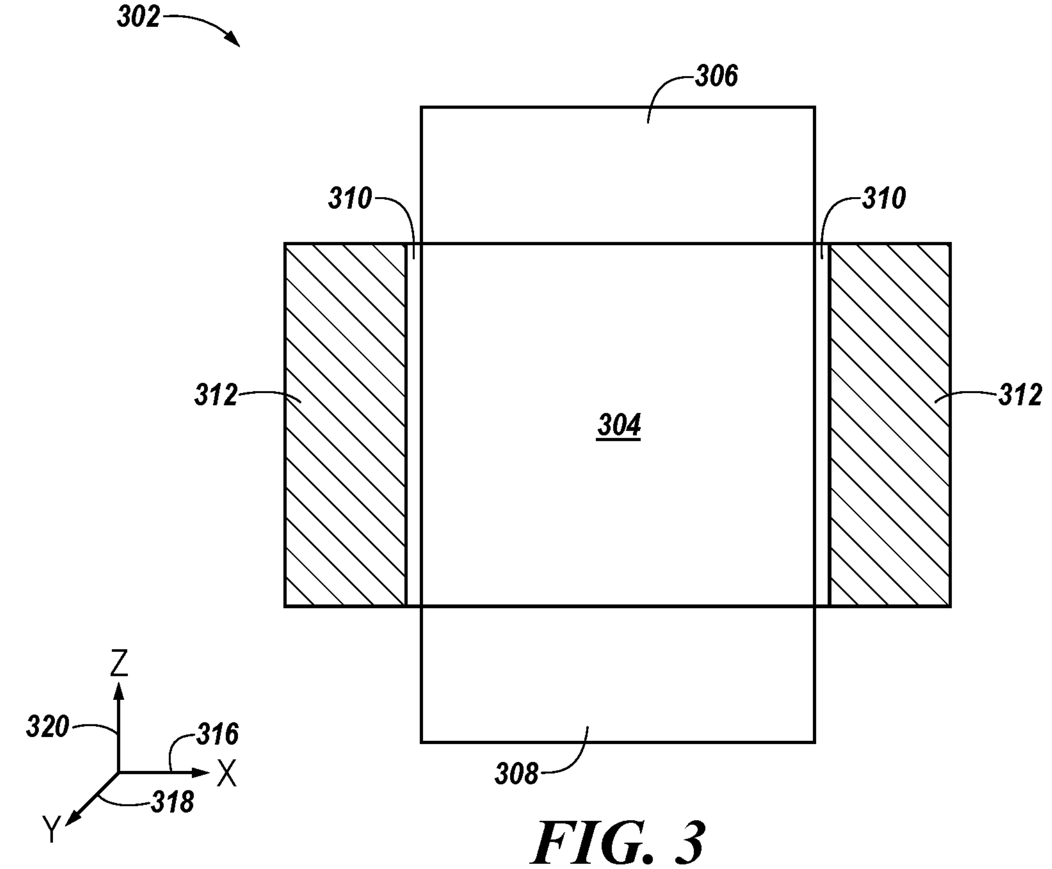
FIG. 3 is a view of a portion of an example of a transistor, in accordance with an embodiment of the present disclosure.

FIG. 3 is a view of a portion of an example of a transistor 302, in accordance with an embodiment of the present disclosure. Transistor 302 may include a channel region 304. As mentioned, embodiments provide that the channel region includes the SbGZO material. The channel region 304 can be formed from materials, as discussed with the channel region 104 shown in FIG. 1.

Transistor 302 can include a first source/drain region 306 and a second source/drain region 308. The first source/drain region 306 and the second source/drain region 308 can be formed from materials, as discussed with the first source/drain region 106 and the second source/drain region 108 shown in FIG. 1. As shown in FIG. 3, the channel region 304 may be located between the first source/drain region 306 and the second source/drain region 308.

Transistor 302 may include a dielectric material 310. The dielectric material 310 can be formed from materials, as discussed with the dielectric material 110 shown in FIG. 1.

Transistor 302 may include a gate material 312. The gate material 312 can be formed from materials, as discussed with the gate material 112 shown in FIG. 1.

While not shown in FIG. 3, transistor 302 may include a substrate. This substrate can be formed from materials, as discussed with the substrate 114 shown in FIG. 1.

FIG. 3 includes an x-y-z coordinate system including a horizontal x-direction 316, a horizontal y-direction 318, and a vertical z-direction 320. Embodiments provide that current flows predominantly in the z-direction 320, e.g., from source/drain region to channel region to source/drain region. As such, transistor 302 may be referred to as being vertically oriented.

Embodiments of the present disclosure are not limited to the physical structure of transistors shown in FIGS. 1-3. For instance, in a number of embodiments, the structure of a transistor may include one or more additional components and/or may have a differing arrangement of materials.

Embodiments provide that the transistors disclosed herein and/or devices including the transistors may be made using various processing techniques such as atomic material deposition (ALD), physical vapor deposition (PVD), chemical vapor deposition (CVD), supercritical fluid deposition (SFD), patterning, etching, filling, chemical mechanical planarization (CMP), combinations thereof, and/or other suitable processes. In accordance with a number of embodiments of the present disclosure, materials may be grown in situ. One or more embodiments provide that the channel region, e.g., that includes the SbGZO material, can be formed with physical vapor deposition. One or more embodiments provide that the channel region, e.g., that includes the SbGZO material, can be formed with atomic layer deposition.

One or more embodiments that the channel region, e.g., that includes the SbGZO material, can be maintained while another material is material selectively removed, e.g., etched, in making the transistors disclosed herein and/or devices including the transistors. One or more embodiments provide that a portion of the channel region, e.g., that includes the SbGZO material, can be selectively removed, e.g., etched, while another material is material is maintained in making the transistors disclosed herein and/or devices including the transistors.

As an example, the transistors disclosed herein and/or devices including the transistors may be made by forming a material stack, e.g., on a substrate, including a number of the channel material, the first source/drain material, the second source/drain material, the dielectric material, and the gate material. The material stack may include one or more additional materials utilized for transistor, and/or devices including transistors, fabrication. Processing steps can include, among others, patterning and etching the material stack, selectively removing a portion of one or more materials, depositing a material, and planarization to make transistors disclosed herein and/or devices including the transistors.

Figure 4:
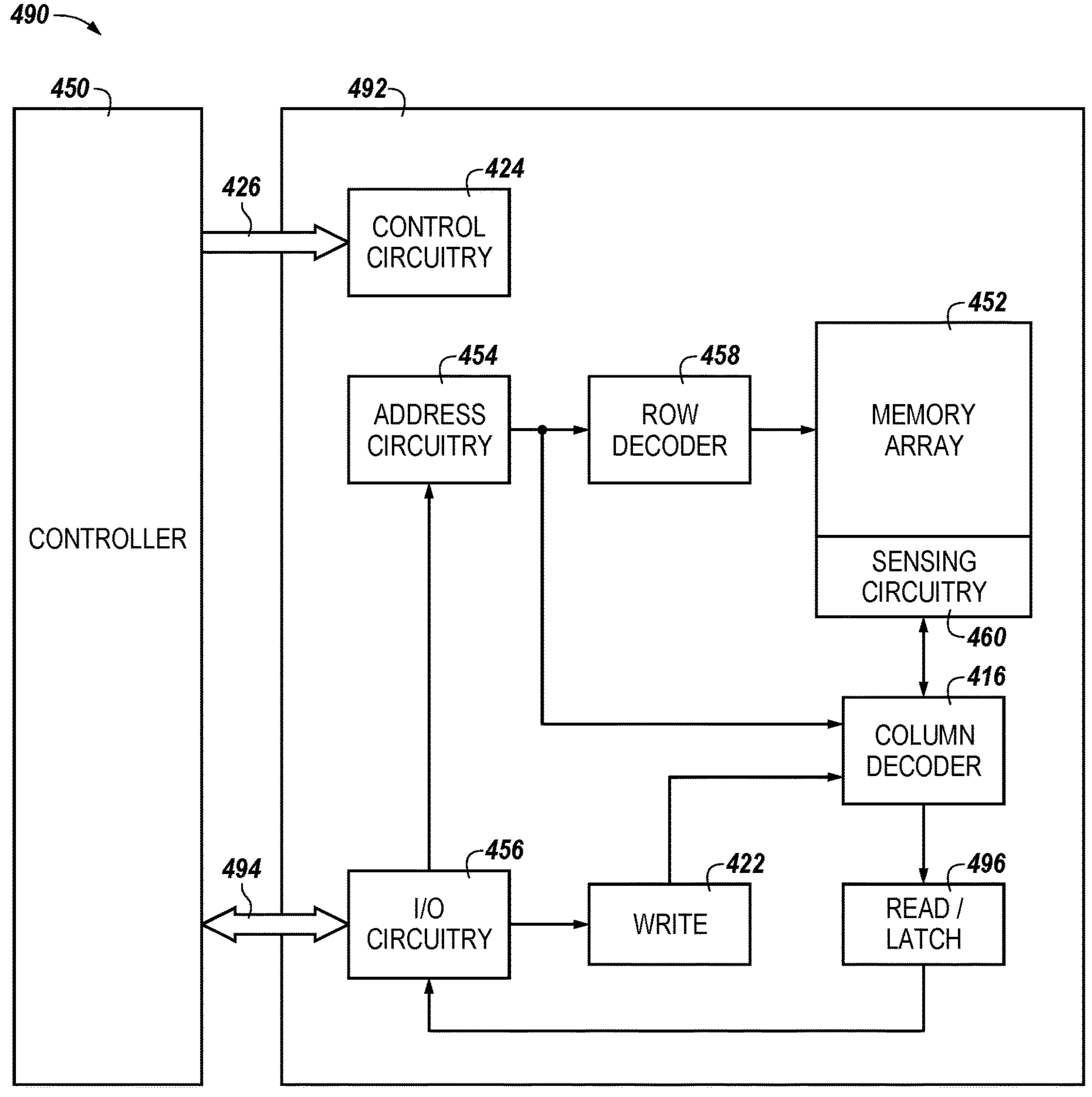
FIG. 4 is a block diagram illustration of an example apparatus, such as an electronic memory system, in accordance with an embodiment of the present disclosure.

FIG. 4 is a block diagram illustration of an example apparatus, such as an electronic memory system 490, in accordance with an embodiment of the present disclosure. Memory system 490 may include an apparatus, such as a memory device 492 and a controller 450, such as a memory controller, e.g., a host controller. Controller 450 might include a processor, for example. Controller 450 might be coupled to a host, for example, and may receive command signals (or commands), address signals (or addresses), and data signals (or data) from the host and may output data to the host.

Memory device 492 includes a memory array 452 of memory cells. For example, memory array 452 may include one or more of the memory arrays, such as a cross-point array, among other types arrays. The memory array 452 may include a number of transistors, e.g., access devices where the channel region includes a SbGZO material, as disclosed herein. Memory device 492 may include address circuitry 454 to latch address signals provided over I/O connections 494 through I/O circuitry 456. Address signals may be received and decoded by a row decoder 458 and a column decoder 416 to access the memory array 452.

Memory device 492 may sense, e.g., read, data in memory array 452 by sensing voltage and/or current changes in the memory array columns using sense/buffer circuitry that in some examples may be read/latch circuitry 496. Read/latch circuitry 496 may read and latch data from the memory array 452. Sensing circuitry 460 may include a number of sense amplifiers coupled to memory cells of memory array 452, which may operate in combination with the read/latch circuitry 496 to sense, e.g., read, memory states from targeted memory cells. I/O circuitry 456 may be included for bi-directional data communication over the I/O connections 494 with controller 450. Write circuitry 422 may be included to write data to memory array 452.

Control circuitry 424 may decode signals provided by control connections 426 from controller 450. These signals may include chip signals, write enable signals, and address latch signals that are used to control the operations on memory array 452, including data read and data write operations.

Control circuitry 424 may be included in controller 450, for example. Controller 450 may include other circuitry, firmware, software, or the like, whether alone or in combination. Controller 450 may be an external controller, e.g., in a separate die from the memory array 452, whether wholly or in part, or an internal controller, e.g., included in a same die as the memory array 452. For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A transistor comprising:

a first source/drain region;

a second source/drain region; and a channel region, wherein the channel region comprises a composite of an antimony-gallium-zinc-oxide (SbGZO) material and an indium gallium zinc oxide material (IGZO), wherein the SbGZO material exhibits an increased n-type doping effect with respect to a GZO material, and wherein at least one of the first source/drain region and the second source/drain region comprises the SbGZO material.

2. The transistor of claim 1, wherein the SbGZO material has a formula $(Sb_xGa_{1-x})_2ZnO_y$.

3. The transistor of claim 2, wherein x has a value from 0.05 to 1.00, inclusive.

4. The transistor of claim 1, wherein the antimony is present in an amount from 2 to 99.9 mole % based upon a total mole % of the antimony and the indium.

5. The transistor of claim 1, wherein the transistor is a horizontally oriented transistor.

6. The transistor of claim 1, wherein the transistor is a vertically oriented transistor.

7. The transistor of claim 1, wherein the SbGZO material is an n-type material.

8. The transistor of claim 1, wherein the transistor includes a gate material.

9. A method of making a transistor, the method comprising: forming a first source/drain region; forming a second source/drain region; and forming a channel region, wherein the channel region is located between the first source/drain region and the second source/drain region, and wherein the channel region comprises a composite of an antimony-gallium-zinc-oxide (SbGZO) material and an indium gallium zinc oxide material (IGZO), wherein the SbGZO material exhibits an increased n-type doping effect with respect to a GZO material, and wherein at least one of the first source/drain region and the second source/drain region comprises the SbGZO material.

10. The method of claim 9, wherein the channel region is formed with physical vapor deposition.

11. The method of claim 9, wherein the channel region is formed with atomic layer deposition.

12. A memory cell, comprising: a transistor comprising: a first source/drain region; a second source/drain region; a channel region, wherein the channel region comprises a composite of an antimony-gallium-zinc-oxide (SbGZO) material and an indium gallium zinc oxide material (IGZO), wherein the SbGZO material exhibits an increased n-type doping effect with respect to a GZO material; and a storage node in operative communication with the transistor, wherein at least one of the first source/drain region and the second source/drain region comprises the SbGZO material.

13. The memory cell of claim 12, wherein the transistor includes a gate material.

14. The memory cell of claim 13, wherein the memory cell includes a substrate supporting the transistor and the storage node.

15. The memory cell of claim 14, wherein the first source/drain region, the second source/drain region, and the channel region, are formed on top of the gate material relative to the substrate.

16. The memory cell of claim 14, wherein the gate material is formed on top of the first source/drain region, the second source/drain region, and the channel region relative to the substrate.

17. The memory cell of claim 12, wherein the storage node comprises a capacitor.

18. The memory cell of claim 12, wherein the transistor is a thin-film transistor.

19. A transistor comprising:

a first source/drain region;

a second source/drain region, wherein at least one of the first source/drain region and the second source/drain region comprises a composite of an antimony-gallium-zinc-oxide (SbGZO) material and an indium gallium zinc oxide material (IGZO), wherein the SbGZO material exhibits an increased n-type doping effect with respect to a GZO material; and a channel region, wherein the channel region comprises the SbGZO material.

20. The transistor of claim 19, wherein both of the first source/drain region and the second source/drain region comprises the antimony-gallium-zinc-oxide (SbGZO) material.

21. A transistor comprising: a first source/drain region; a second source/drain region; and a channel region comprising an oxide material doped with antimony, wherein at least one of the first source/drain region and the second source/drain region comprises a composite of an antimony-gallium-zinc-oxide (SbGZO) material and an indium gallium zinc oxide material (IGZO), and wherein the SbGZO material exhibits an increased n-type doping effect with respect to a GZO material.

22. The transistor of claim 21, wherein the oxide material is selected ZTO, IZO, ZnOx, InOx, In2O3, SnO2, TiOx, ZnxOyNz, MgxZnyOz, InxZnyOz, InxGayZnzOa, ZrxlnyZnzOaZrxInyZnzOa, HfxlnyZnzOaHfxInyZnzOa, SnxlnyZnzOaSnxInyZnzOa, AlxSnylnzZnaOdAlxSnyInzZnaOd, SixlnyZnzOaSixInyZnzOa, ZnxSnyOz, AlxZnySnzOa, GaxZnySnzOa, GaxZnySnzInaOd, ZrxZnySnzOa, and InGaSiO.

* * * * *